(12) United States Patent
Mochizuki et al.

(10) Patent No.: US 11,038,415 B2
(45) Date of Patent: Jun. 15, 2021

(54) POWER SUPPLY DEVICE

(71) Applicant: Panasonic Intellectual Property Management Co., Ltd., Osaka (JP)

(72) Inventors: Kento Mochizuki, Tokyo (JP); Shuhei Chizuwa, Tokyo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 26 days.

(21) Appl. No.: 16/679,353

(22) Filed: Nov. 11, 2019

(65) Prior Publication Data
US 2020/0076293 A1 Mar. 5, 2020

Related U.S. Application Data

(63) Continuation of application No. PCT/JP2018/021634, filed on Jun. 6, 2018.

(30) Foreign Application Priority Data

Jul. 12, 2017 (JP) .............................. JP2017-136018

(51) Int. Cl.
H02M 1/12 (2006.01)
H02J 1/02 (2006.01)
(Continued)

(52) U.S. Cl.
CPC .............. *H02M 1/126* (2013.01); *H02J 1/02* (2013.01); *H02J 7/00* (2013.01); *H02M 1/44* (2013.01);
(Continued)

(58) Field of Classification Search
CPC .......... H02M 1/12; H02M 1/126; H02M 1/44; H02J 1/02; H02J 7/00; H02J 2207/20; H03H 7/0115
(Continued)

(56) References Cited

U.S. PATENT DOCUMENTS

| | | | |
|---|---|---|---|
| 2008/0157594 A1* | 7/2008 | Peterson | ................. H02P 9/307 307/10.1 |
| 2017/0201092 A1 | 7/2017 | Minato | |

FOREIGN PATENT DOCUMENTS

| | | |
|---|---|---|
| JP | 2001-089087 | 4/2001 |
| JP | 2016-025713 | 2/2016 |

OTHER PUBLICATIONS

International Search Report of PCT application No. PCT/JP2018/021634 dated Jul. 10, 2018.

* cited by examiner

*Primary Examiner* — Hal Kaplan
(74) *Attorney, Agent, or Firm* — Seed IP Law Group LLP

(57) ABSTRACT

In a power supply device, a first switching power supply is disposed in a first power line connecting a receiver for receiving power from an external power supply and the power storage device and converts the power received from the external power supply to supply it to the power storage device. A second switching power supply is disposed in the second power line including a first end connected the first power line at a branch point, and a second end connected to the load device, and converts the power received from the power storage device to supply it to the load device. The first noise removal filter is disposed between the branch point and the power storage device in the first power line. The second noise removal filter is disposed between the branch point and the second switching power supply in the second power line.

8 Claims, 5 Drawing Sheets

(51) Int. Cl.
*H02J 7/00* (2006.01)
*H02M 1/44* (2007.01)
*H03H 7/01* (2006.01)

(52) U.S. Cl.
CPC ........ *H03H 7/0115* (2013.01); *H02J 2207/20* (2020.01)

(58) Field of Classification Search
USPC .......................................................... 307/20
See application file for complete search history.

POWER SUPPLY DEVICE

CROSS-REFERENCE TO RELATED APPLICATIONS

This application is a continuation of the PCT International Application No. PCT/JP2018/021634 filed on Jun. 6, 2018, which claims the benefit of foreign priority of Japanese patent application No. 2017-136018 filed on Jul. 12, 2017, the contents all of which are incorporated herein by reference.

BACKGROUND

1. Technical Field

The present disclosure relates to a power supply device.

2. Description of the Related Art

Conventionally, a power supply device including a switching power supply is known.

A switching element used for a switching power supply generates harmonic noise and high-frequency noise (hereinafter, collectively referred to as "switching noise") according to a change in current/voltage during operation. The generated switching noise is conducted in an input direction and an output direction of the switching power supply, so that the switching noise affects apparatuses connected in the both directions respectively and causes a malfunction in each of the apparatuses.

Conventionally, as measures against such switching noise, a line filter for removing the switching noise is disposed in a power line (for example, see Japanese Unexamined Patent Publication No. 2016-025713 (hereinafter referred as Patent Literature 1)).

FIG. 1 is a diagram showing one example of the configuration of power supply device 1a in a conventional art disclosed in Patent Literature 1.

First switching power supply 110 converts the power supplied from external power supply S (for example, commercial alternating-current (AC) power supply) by switching, and supplies the converted power to power storage device E. Second switching power supply 120 converts the power supplied from power storage device E by switching, and supplies the converted power to load device R. Here, first switching power supply 110 is formed of AC/direct-current (DC) converter 111 and DC/DC converter 112, and second switching power supply 120 is formed of a DC/DC converter, for example.

Line filter 40a is disposed on the input side of first switching power supply 110. Line filter 60a is disposed on the output side of second switching power supply 120. Line filter 50a is disposed on the output side of first switching power supply 110 and on the input side of second switching power supply 120. Line filters 40a, 50a, and 60a are disposed for removing the switching noise. As line filters 40a, 50a, and 60a, generally, choke coils (for example, common-mode choke coils) or the like are employed.

First switching power supply 110, second switching power supply 120, and line filters 40a, 50a, and 60a are covered with shield 130 in order to suppress the radiation noise emitted to the outside.

In the conventional art related to Patent Literature 1, in order to reduce the number of line filters and to reduce the size, line filter 50a has two functions. As one function, line filter 50a removes the noise generated from first switching power supply 110 when power is supplied from external power supply S to power storage device E (dotted line arrow). As the other function, line filter 50a removes the noise generated from second switching power supply 120 when power is supplied from power storage device E to load device R (one-dotted chain line arrow).

SUMMARY

The power supply device of the present disclosure includes a first power line, a first switching power supply, a second power line, a second switching power supply, a first noise removal filter, and a second noise removal filter. The first power line connects a receiver for receiving power from an external power supply to the power storage device. The first switching power supply is disposed in the first power line, and converts the power received from the external power supply into first converted power by switching and supplies the first converted power to the power storage device. The second power line includes a first end connected to the first power line at a branch point, and a second end connected to a load device. The second switching power supply is disposed in the second power line, and converts the power received from the power storage device into second converted power by switching and supplies the second converted power to the load device. The first noise removal filter is disposed between the branch point and the power storage device in the first power line. The second noise removal filter is disposed between the same branch point and the second switching power supply in the second power line.

The power supply device of the present disclosure, while suppressing the upsizing, can charge a power storage device with a large current and can reduce the switching noise conducted from a switching power supply to the outside.

DETAILED DESCRIPTION OF PREFERRED EMBODIMENTS

Recently, there is a demand for enhancing the measures against electromagnetic interference (EMI), and a demand for further reducing the switching noise conducted to power storage device E via a power line.

Due to such demand, the case is assumed where the characteristics (noise attenuation capacity and current capacity) required to power lines L11 and the characteristics required to power lines L12 are different from each other. Power lines L11 are disposed between first switching power supply 110 and connectors C, and power lines L12 are disposed between second switching power supply 120 and connectors C.

In such a case, when both characteristics are intended to be satisfied with a single line filter, the choke coil constituting the line filter is upsized and hence the power supply device is upsized.

The present disclosure is developed in consideration of the above-mentioned problems. The present disclosure provides a power supply device that, while suppressing the upsizing, can charge a power storage device with a large current and can reduce the switching noise conducted to the outside.

Hereinafter, various exemplary embodiments of the present disclosure are described in detail with reference to the accompanying drawings. Components having substantially the same functional configuration are denoted by the same reference marks, and the duplicate descriptions of those components are omitted.

First Exemplary Embodiment

Configuration of Power Supply Device

Hereinafter, the configuration of power supply device 1A in accordance with a first exemplary embodiment of the present disclosure is described with reference to FIG. 2 and FIG. 3. Power supply device 1A is an on-vehicle power supply device applied to a vehicle, for example.

Figure 1:
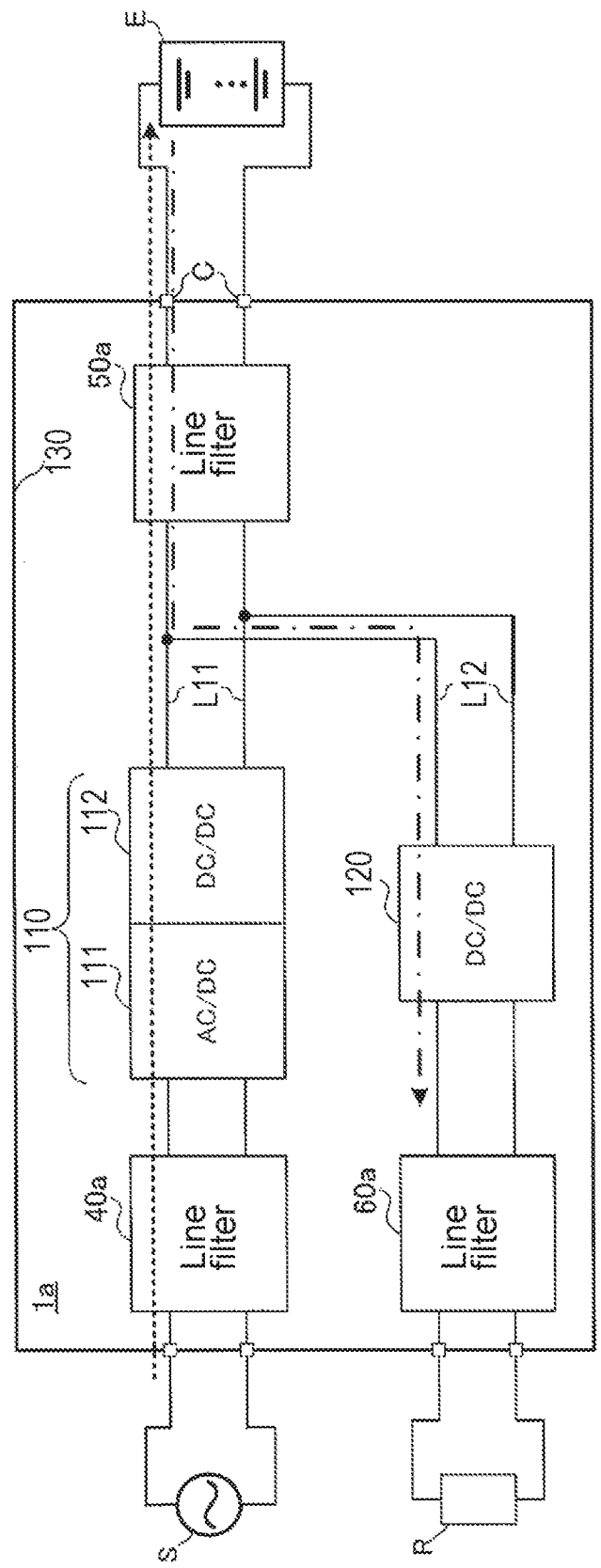
FIG. 1 is a diagram showing one example of a configuration of a power supply device in a conventional art.
Figure 2:
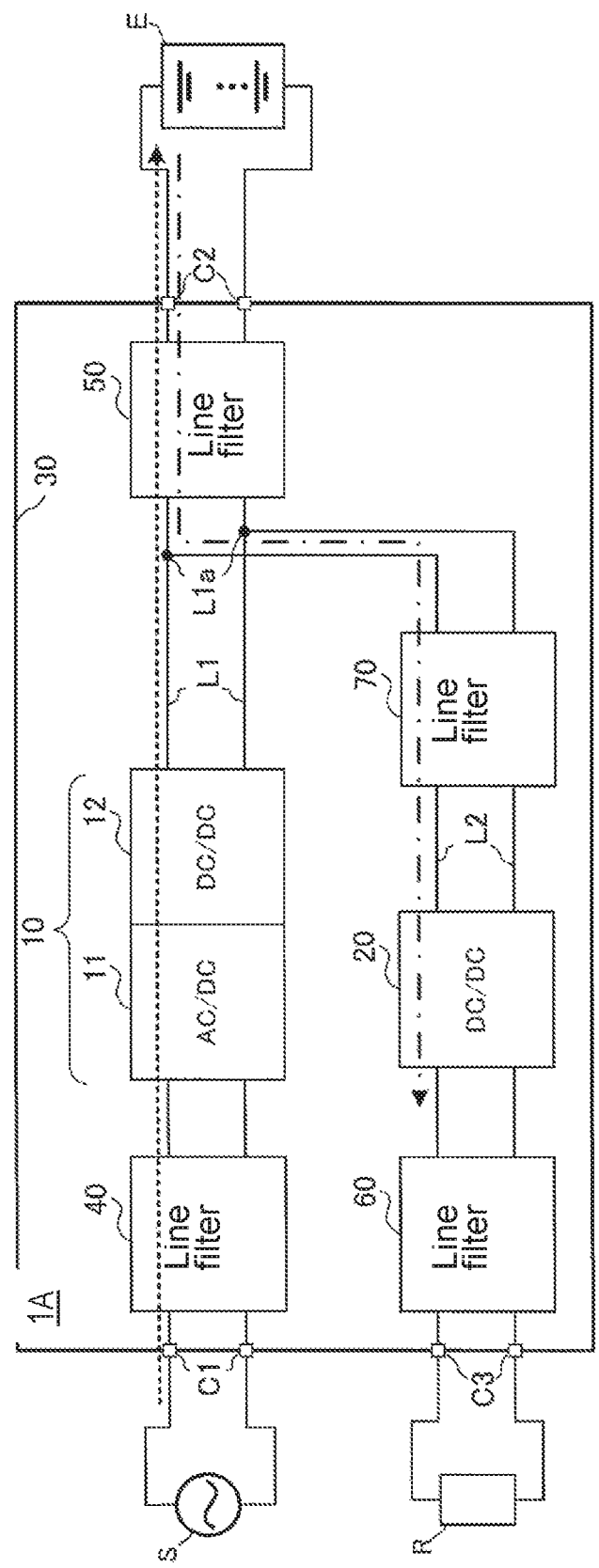
FIG. 2 is a diagram showing one example of a configuration of a power supply device in accordance with a first exemplary embodiment of the present disclosure.

FIG. 2 is a diagram showing one example of the configuration of power supply device 1A. FIG. 3 is a diagram showing one example of each of the internal configurations of first noise removal filter 50, second noise removal filter 70, third removal filter 40, and fourth noise removal filter 60 (hereinafter, referred to as line filters 50, 70, 40, and 60).

Power supply device 1A includes first switching power supply 10, second switching power supply 20, shield 30, and line filters 40, 50, 60, and 70.

First switching power supply 10 converts the power supplied from external power supply S into converted power by switching, and supplies the converted power to power storage device E. Second switching power supply 20 converts the power supplied from power storage device E into converted power by switching, and supplies the converted power to load device R. First switching power supply 10, second switching power supply 20, and line filters 40 to 70 are covered with shield 30 in order to suppress the radiation noise emitted to the outside.

Power supply device 1A is connected to external power supply S via connectors C1 as a receiver, connected to power storage device E via connectors C2, and connected to load device R via connectors C3.

First power lines L1 connect between connectors C1 and connectors C2. In other words, first power lines L1 connect between external power supply S and power storage device E. The first ends of second power lines L2 are connected to first power lines L1 at branch points L1a, and the second ends thereof are connected to load device R via connectors C3. Here, branch points L1a correspond to the positions between first switching power supply 10 and line filter 50 in first power lines L1.

The dotted line arrow in FIG. 2 shows a current path when external power supply S charges power storage device E. The one-dotted chain line arrow shows a current path when power storage device E discharges power to load device R.

External power supply S is a commercial AC power supply for supplying the power of single phase AC, for example.

Power storage device E is a high voltage battery for driving a drive motor or the like of the vehicle, for example. As power storage device E, for example, a lithium-ion secondary battery, a nickel-metal hydride secondary battery, or electric double layer capacitor is employed.

Load device R is an electric component (headlight, wiper, or audio system) mounted to the vehicle, for example, or a low voltage battery for driving the electric component.

First switching power supply 10 is disposed in first power lines L1. First switching power supply 10 converts the power received from external power supply S into converted power by switching, and supplies the converted power to power storage device E. First switching power supply 10 is a normal charger for converting AC power into DC power appropriate for charging power storage device E. First switching power supply 10 includes AC/DC converter 11 and DC/DC converter 12. AC/DC converter 11 converts the AC power supplied from external power supply S into DC power. DC/DC converter 12 converts the voltage of the DC power supplied from AC/DC converter 11. First switching power supply 10 converts the power received from external power supply S into the converted power, and supplies the converted power to power storage device E in a single direction. In other words, first switching power supply 10 does not convert the power received from power storage device E into converted power, and does not supply the converted power to external power supply S.

Second switching power supply 20 is disposed in second power lines L2. Second switching power supply 20 converts the power received from power storage device E into the converted power by switching, and supplies the converted power to load device R. Second switching power supply 20 includes a DC/DC converter, which changes the voltage of the DC power supplied from power storage device E and supplies the DC power with a changed voltage to load device R, for example. Second switching power supply 20 converts the power received from power storage device E into the converted power, and supply the converted power to load device R in a single direction. In other words, second switching power supply 20 does not convert the power received from load device R (low voltage battery) into the converted power, and does not supply the converted power to power storage device E.

Shield 30 blocks the radiation noise generated from each unit in power supply device 1A. Shield 30 is a metal casing, for example, and is configured to integrally cover first switching power supply 10, second switching power supply 20, and line filters 40, 50, 60, and 70.

Line filters 40 to 70 are noise removal filters for reducing the switching noise generated from first switching power supply 10 and second switching power supply 20.

Specifically, line filter 40 is disposed in first power lines L1 between first switching power supply 10 and connectors C1. Line filter 40 removes the switching noise generated from first switching power supply 10 when external power supply S charges power storage device E.

Line filter 50 is disposed in first power lines L1 between first switching power supply 10 and power storage device E. Line filter 50 removes the switching noise generated from first switching power supply 10 when external power supply S charges power storage device E. Furthermore, as discussed above, branch points (junctions) L1a between first power lines L1 and second power lines L2 are located between first switching power supply 10 and line filter 50. Therefore, line filter 50 also removes the switching noise generated from second switching power supply 20 when power storage device E discharges power to load device R.

Line filter 60 is disposed in second power lines L2 between second switching power supply 20 and load device R. Line filter 60 removes the switching noise generated from second switching power supply 20 when power storage device E discharges the power to load device R.

Line filter 70 is disposed in second power lines L2 between second switching power supply 20 and branch points L1a. Line filter 70 removes the switching noise generated from second switching power supply 20 when power storage device E discharges the power to load device R.

Figure 3:
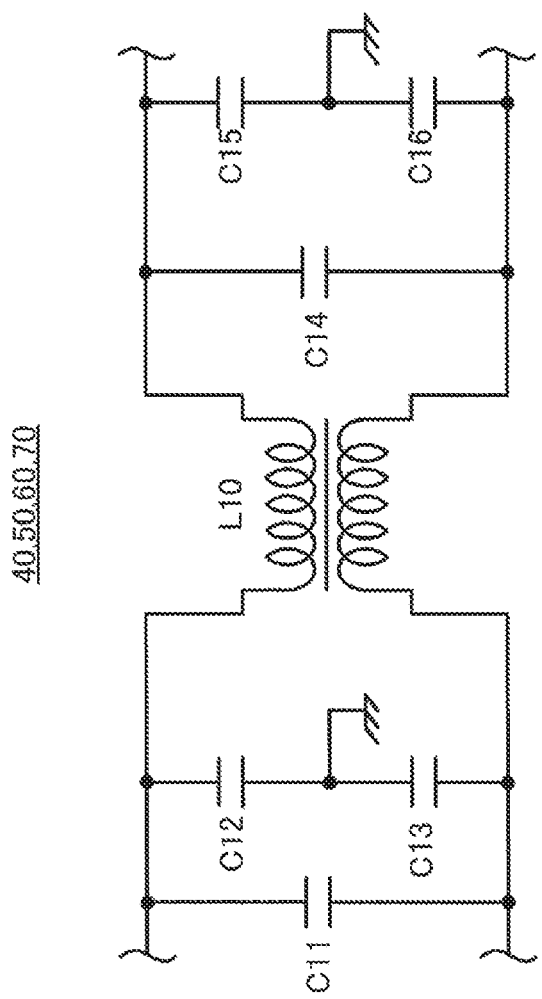
FIG. 3 is a diagram showing one example of an internal configuration of a line filter.

Each of line filters 40, 50, 60, and 70 includes capacitors C11 to C16 and common-mode choke coil L10, for example, as shown in FIG. 3.

Each of line filters 40, 50, 60, and 70 includes common-mode choke coil L10 in order to effectively remove the noise of a common mode component included in a flowing current. However, the configuration of each of line filters 40, 50, 60, and 70 is not limited to the configuration shown in FIG. 3, and any configuration capable of reducing the switching noise is applicable. The configurations of line filters 40, 50, 60, and 70 may be different from each other.

Operation of Power Supply Device

Next, the operation of power supply device 1A is described.

When external power supply S charges power storage device E as shown by the dotted line arrow, first switching power supply 10 operates. At this time, first switching power supply 10 converts the AC power supplied from external power supply S into DC power, and supplies the DC power to power storage device E.

In this current path, line filter 40 is disposed on the input side of first switching power supply 10, and line filter 50 is disposed on the output side of first switching power supply 10. The switching noise generated from first switching power supply 10 is reduced by line filters 40 and 50.

When power storage device E discharges power to load device R as shown by one-dotted chain line arrow, second switching power supply 20 operates. At this time, second switching power supply 20 converts the DC power supplied from power storage device E, and supplies the converted DC power to load device R.

In this current path, line filters 50 and 70 are disposed on the input side of second switching power supply 20, and line filter 60 is disposed on the output side of second switching power supply 20. The switching noise generated from second switching power supply 20 is reduced by line filters 50 to 70.

Characteristic of Line Filter

Next, the characteristics of line filters 40, 50, 60, and 70 are described.

Recently, the line filter disposed between second switching power supply 20 and connectors C2 is required to have a high noise-attenuation capacity. Meanwhile, for the on-vehicle power supply device, for example, a regulation value of the switching noise emitted from the switching power supply is defined according to the ECE-R10-04 standard or the like.

The reason why such a demand is issued is not only for reducing the switching noise flowing into load device R, but also mainly for supporting fast charging equipment for fast-charging power storage device E mounted to the vehicle. A connection plug of the fast charging equipment is generally connected to a positive terminal and negative terminal of power storage device E directly without power supply device 1A therebetween. In other words, a power line responsive to the fast charging equipment is connected between connectors C2 and power storage device E.

Generally, a fast charge by the fast charging equipment and a normal charge by first switching power supply 10 as a normal charger are not simultaneously performed. Here, the normal charger converts AC power into DC power appropriate for charging power storage device E.

On the other hand, second switching power supply 20 sometimes operates also during the fast charge by the fast charging equipment in accordance with the state of load device R.

When the line filter disposed between second switching power supply 20 and connectors C2 has a low noise attenuation capacity, there is a risk in which the switching noise generated by the operation of second switching power supply 20 flows into the fast charging equipment via the connection plug.

Therefore, the line filter disposed between second switching power supply 20 and connectors C2 is required to have a noise attenuation capacity higher than that required to the line filter disposed between first switching power supply 10 and connectors C2.

The line filter disposed in a current path when external power supply S charges power storage device E is required to have a high current capacity for allowing the charge with high power. In other words, the line filter disposed between first switching power supply 10 and connectors C2 is required to have a current capacity higher than that required to the line filter disposed between second switching power supply 20 and connectors C2.

In the conventional art according to Patent Literature 1, line filter 50a has the function of removing the noise generated from first switching power supply 110 and the function of removing the noise generated from second switching power supply 120. In this case, line filter 50a is required to have both a high current capacity and a high noise-attenuation capacity. As the result, line filter 50a becomes large in size.

The size of a line filter mainly depends on the current capacity and noise-attenuation capacity. In more detail, the current capacity of the line filter mainly depends on the diameter of the winding of the choke coil, and the noise-attenuation capacity of the line filter mainly depends on the number of turns of the winding of the choke coil. In other words, a choke coil used for a line filter having a high current capacity and a high noise-attenuation capacity must be produced by winding a thick wire in many turns.

In power supply device 1A, line filter 50 having a high current capacity has a function of removing the noise generated from first switching power supply 10 and the function of removing the noise generated from second switching power supply 20. This configuration is similar to that of the conventional art according to Patent Literature 1.

On the other hand, in power supply device 1A, a high noise-attenuation capacity is secured by disposing line filter 70 in second power lines L2 branching from first power lines L1 at branch points L1a.

In other words, in power supply device 1A, a function of removing the switching noise generated by the operation of second switching power supply 20 is secured by two line filters (line filters 50 and 70).

Thanks to the above mentioned configuration, line filter 50 can be designed so as to have a characteristic having a relatively high current capacity. Line filter 70 can be designed so as to compensate for the shortage of the noise attenuation capacity in line filter 50 when removing the switching noise generated from second switching power supply 20.

Line filter 50 and line filter 70 are designed so as to have different characteristics from each other. Line filter 50 only needs to be designed so as to have a characteristic in which the noise-attenuation capacity is lower and the current capacity is higher than line filter 70.

More specifically, line filter 50 satisfying the characteristic (noise-attenuation capacity and current capacity) required between first switching power supply 10 and connectors C2 is disposed between branch points L1a and power storage device E (connectors C2).

In other words, line filter 50 satisfying the characteristic required between first switching power supply 10 and connectors C2 is used also as a line filter disposed between second switching power supply 20 and connectors C2.

On the other hand, line filter 50 satisfying the characteristic required between first switching power supply 10 and connectors C2 is not sufficient for the noise-attenuation capacity required between second switching power supply 20 and connectors C2.

Therefore, line filter 70 satisfying the characteristic for compensating for the shortage of the noise-attenuation capacity in line filter 50 is disposed in second power lines L2 branching from first power lines L1 at branch points L1a.

The characteristic of line filter 70 only needs to compensate for the shortage of the noise-attenuation capacity in line filter 50 and to satisfy the current capacity between second switching power supply 20 and connectors C2.

As discussed above, this current capacity is lower than that between first switching power supply 10 and connectors C2. Therefore, line filter 70 can be downsized.

Thus. the noise-attenuation capacity of line filter 70 needs to be set, on the basis of the value that is obtained by subtracting the noise attenuation capacity of line filter 50 from the noise attenuation capacity required for removing the switching noise of second switching power supply 20.

As discussed above, line filter 50 that is required to have a high current capacity and is disposed between first switching power supply 10 and connectors C2 is also disposed between second switching power supply 20 and connectors C2. Then, line filter 70 between second switching power supply 20 and branch points L1a compensates for the shortage of the noise-attenuation capacity in line filter 50.

Thus, the total size of line filters 50 and 70 can be reduced compared with the case where one line filter 50a is used as the conventional art according to Patent Literature 1. Line filter 50 removes both the noise generated from first switching power supply 10 and the noise generated from second switching power supply 20. Therefore, even compared with the case where line filters are disposed in two switching power supplies, respectively, the total size can be downsized.

In power supply device 1A, in order to support a high current capacity, "the line filter satisfying the characteristic required between second switching power supply 20 and connectors C2" is not used, but "the line filter satisfying the characteristic required between first switching power supply 10 and connectors C2" is commonly used. As discussed above, first switching power supply 10 and second switching power supply 20 each perform the power conversion only in a single direction. Therefore, for example, power is not simultaneously supplied from both first switching power supply 10 and second switching power supply 20 to power storage device E. Therefore, the current capacity of line filter 40 needs to satisfy the following characteristic. The characteristic corresponds not to the current value obtained by adding the current value flowing between first switching power supply 10 and connectors C2 and the current value flowing between second switching power supply 20 and connectors C2, but to the current value flowing between first switching power supply 10 and connectors C2 where a large current flows.

Through line filter 40, similarly to line filter 50, a large current flows when external power supply S charges power storage device E. Therefore, the current capacity of line filter 40 may be high. Furthermore, similarly to line filter 70, line filter 60 reduces the switching noise traveling toward load device R when power is supplied from power storage device E to load device R. Therefore, the noise-attenuation capacity of line filter 60 may be high.

As discussed above, in power supply device 1A, when external power supply S charges power storage device E, only line filter 50 having a high current capacity is used as a noise removal filter. When power storage device E discharges power to load device R, line filter 50 and line filter 70 are used as a noise removal filter so as to achieve a high attenuation capacity. Therefore, while suppressing the upsizing, power supply device 1A can charge power storage device E with a large current and can reduce the switching noise conducted to the outside.

Second Exemplary Embodiment

Figure 4:
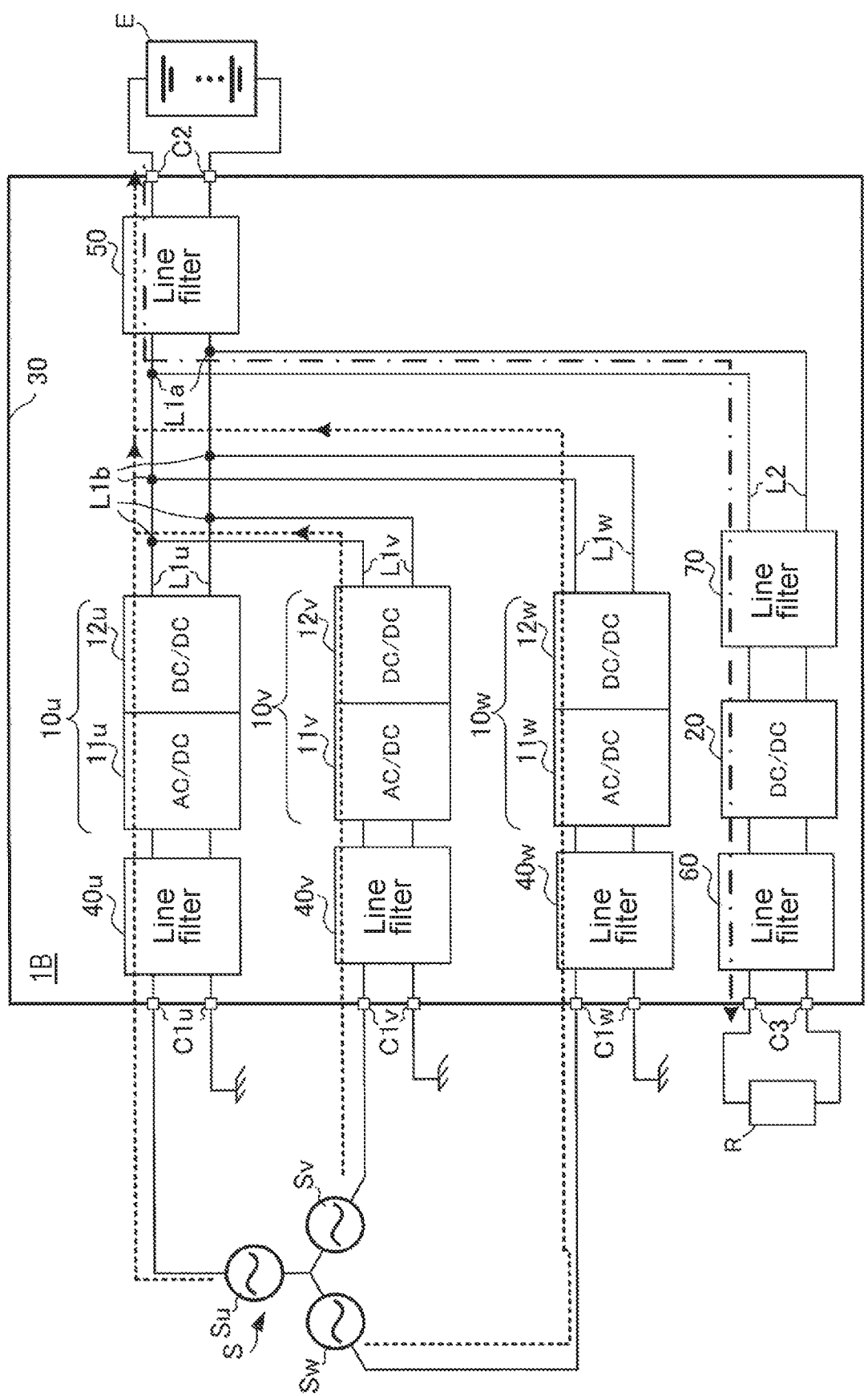
FIG. 4 is a diagram showing one example of a configuration of a power supply device in accordance with a second exemplary embodiment of the present disclosure.

Next, power supply device 1B in accordance with a second exemplary embodiment is described with reference to FIG. 4. FIG. 4 is a diagram showing one example of the configuration of power supply device 1B. Power supply device 1B is different from the first exemplary embodiment in that power supply device 1B is applied to three-phase AC external power supply S.

Power supply device 1B includes U-phase connectors C1u, V-phase connectors C1v, and W-phase connectors C1w. They are used as receivers each for receiving power of respective one of phases of three-phase AC external power supply S. In FIG. 4, U-phase is denoted as Su, V-phase is denoted as Sv, and W-phase is denoted as Sw. Power supply device 1B includes U-phase first switching power supply 10u, V-phase first switching power supply 10v, and W-phase first switching power supply 10w correspondingly to connectors C1u, C1v, and C1w, respectively. Furthermore, power supply device 1B includes U-phase line filter 40u, V-phase line filter 40v, and W-phase line filter 40w.

At coupling points L1b, U-phase first power lines L1u extending from connectors C1u, V-phase first power lines L1v extending from connectors C1v, and W-phase first power lines L1w extending from connectors C1w are coupled to one power line set. In the present exemplary embodiment, first power lines L1u, L1v, and L1w are coupled to the one power line set between branch points L1a and switching power supplies 10u, 10v, and 10w.

Each of first switching power supply 10u, first switching power supply 10v, and first switching power supply 10w has a configuration similar to that of first switching power supply 10 described in the first exemplary embodiment. In other words, first switching power supply 10u includes AC/DC converter 11u and DC/DC converter 12u. First switching power supply 10v includes AC/DC converter 11v and DC/DC converter 12v. First switching power supply 10w includes AC/DC converter 11w and DC/DC converter 12w. Each of AC/DC converters 11u, 11v, and 11w is similar to AC/DC converter 11 in the first exemplary embodiment. Each of DC/DC converters 12u, 12v, and 12w is similar to DC/DC converter 12 in the first exemplary embodiment. Each of line filters 40u, 40v, and 40w has a configuration similar to that of line filter 40 described in the first exemplary embodiment.

Also in power supply device 1B, similarly to power supply device 1A, there is a possibility that, when power is supplied from external power supply S to power storage device E (dotted line arrow), noise is generated from first switching power supplies 10u, 10v, 10w. There is a possibility that, when power is supplied from power storage device E to load device R (one-dotted chain line arrow), noise is generated from second switching power supply 20. Line filter 50 serves the function of removing the noise generated from first switching power supplies 10u, 10v, 10w. Furthermore, line filter 50 and line filter 70 serve the function of removing the noise generated from second switching power supply 20.

As discussed above, even when a multiphase AC power supply is used as external power supply S, power supply device 1B, while suppressing the upsizing, can charge power storage device E with a large current and can reduce the switching noise conducted to the outside.

Modified Example of Second Exemplary Embodiment

Figure 5:
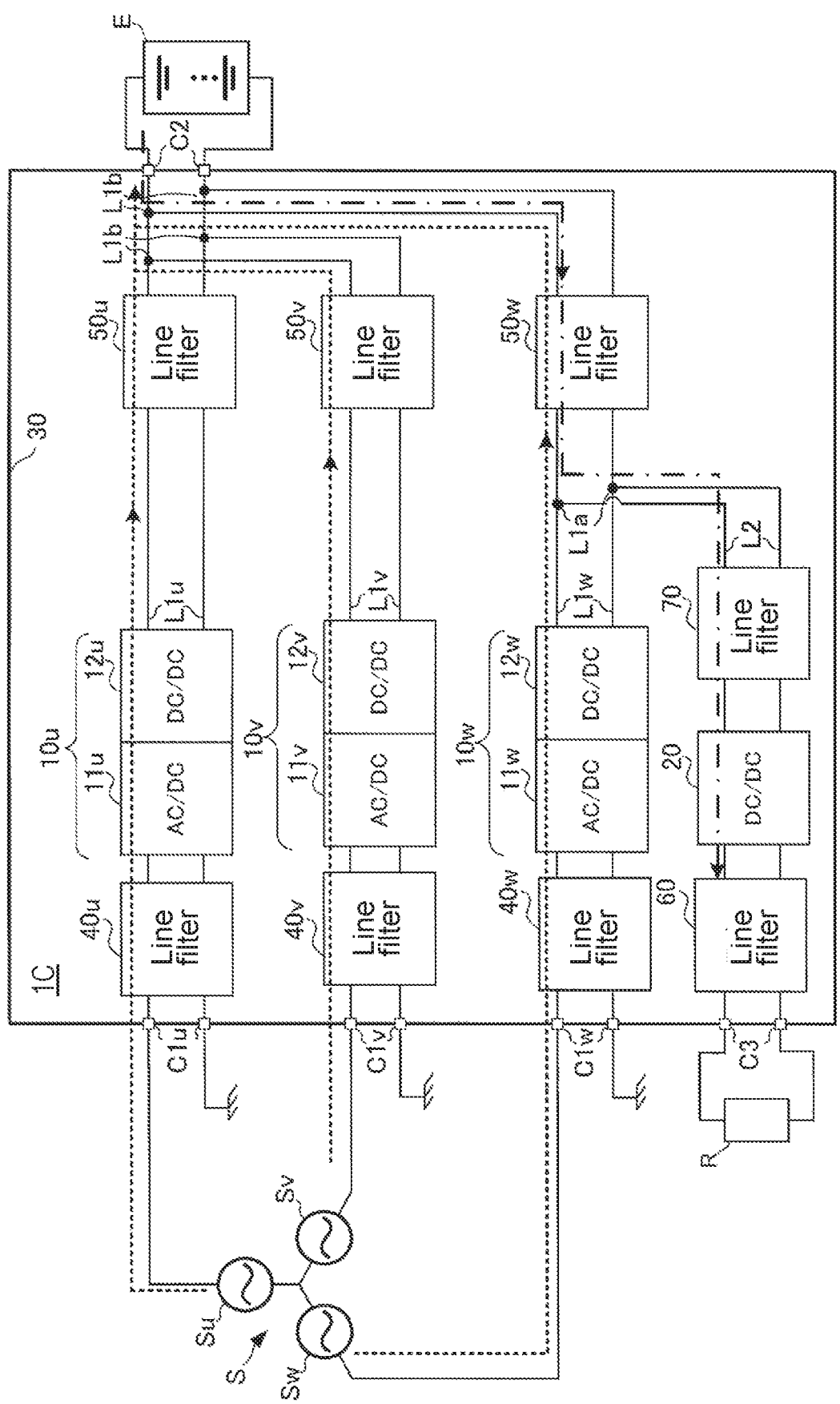
FIG. 5 is a diagram showing one example of a configuration of a power supply device in accordance with a modified example of the second exemplary embodiment of the present disclosure.

FIG. 5 is a diagram showing one example of the configuration of power supply device 1C in accordance with a modified example of the second exemplary embodiment.

In power supply device 1C, line filters 50u, 50v, and 50w are disposed between first switching power supplies 10u, 10v, 10w and power storage device E, respectively. Power supply device 1C is different from power supply device 1B in this respect.

Due to provide such a configuration, coupling points L1b of first power lines L1u, L1v, and L1w are located between line filters 50u, 50v, and 50w and power storage device E, respectively. The first ends of second power lines L2 are connected to first power lines L1w at branch points L1a, and the second ends thereof are connected to load device R.

Also in power supply device 1C, similarly to power supply device 1B, there is a possibility that, when power is supplied from external power supply S to power storage device E (dotted line arrow), noise is generated from first switching power supplies 10u, 10v, 10w. There is a possibility that, when power is supplied from power storage device E to load device R (one-dotted chain line arrow), noise is generated from second switching power supply 20. Line filters 50u, 50v, and 50w serve the function of removing the noise generated from first switching power supplies 10u, 10v, 10w. Furthermore, line filter 50w and 70 serve the function of removing the noise generated from second switching power supply 20.

Thus, when power is supplied from external power supply S to power storage device E (dotted line arrow), power supply device 1C can disperse the flowing current to line filters 50u, 50v, and 50w.

In other words, power supply device 1C can disperse, to line filters 50u, 50v, and 50w, the function of removing the noise generated from first switching power supplies 10u, 10v, 10w. This function is performed by line filter 50 in the second exemplary embodiment. Thus, the whole size of the line filters can be further reduced.

As discussed above, even when a multiphase AC power supply is used as external power supply S, power supply device 1C can further reduce the size, charge storage device E with a large current, and further reduce the switching noise conducted to the outside.

In FIG. 5, branch points L1a as ends of second power lines L2 are connected to first power line L1w. However, power supply device 1C is not limited to this configuration. Branch points L1a may be connected to either of first power lines L1u and L1v instead of first power lines L1w. Furthermore, the first ends of second power lines L2 may be connected to first power lines L1u, L1v, and L1w.

Other Exemplary Embodiment

The present disclosure is not limited to the above mentioned exemplary embodiments, and various deformations are considered.

The power supply devices 1A to 1C have connectors C1 as one example of a receiver for receiving power from external power supply S. However, the receiver may be a receiving coil or the like for receiving power from external power supply S using electromagnetic induction or the like.

Furthermore, in power supply device 1A, first switching power supply 10 includes AC/DC converter 11 and DC/DC converter 12, and second switching power supply 20 includes DC/DC converter. As first switching power supply 10 and second switching power supply 20, however, various types of switching power supply can be applied.

As one example of the operations of power supply devices 1A to 1C, the case has been described where the operation of power supply from external power supply S to power storage device E and the operation of power supply from power storage device E to load device R are separately performed. However, the operation of power supply from external power supply S to power storage device E and the operation of power supply from external power supply S to load device R may be simultaneously performed. In this case, both first switching power supply 10 and second switching power supply 20 operate.

Thus, the specific examples of the present disclosure have been described in detail, but these are simply examples and do not limit the scope of the claims The technologies described in the scope of the claims include various deformations and modifications of the described specific examples.

A power supply device of the present disclosure, while suppressing the upsizing, can charge a power storage device with a large current and can reduce the switching noise conducted from a switching power supply to the outside.

What is claimed is:

1. A power supply device comprising:
   a first power line configured to couple a receiver for receiving power from an external power supply to a power storage device;
   a first switching power supply disposed in the first power line, and configured to convert the power received from the external power supply into first converted power by switching and to supply the first converted power to the power storage device;
   a second power line including a first end a second end, the first end being coupled to the first power line at a branch point, the second end being coupled to a load device;
   a second switching power supply disposed in the second power line, and configured to convert power received from the power storage device into second converted power by switching and to supply the second converted power to the load device;

a first noise removal filter disposed between the branch point and the power storage device in the first power line; and a second noise removal filter disposed between the branch point and the second switching power supply in the second power line.

2. The power supply device according to claim 1,
wherein the first noise removal filter and the second noise removal filter have characteristics different from each other.

3. The power supply device according to claim 2,
wherein a noise attenuation capacity of the first noise removal filter is lower than a noise attenuation capacity of the second noise removal filter, and a current capacity of the first noise removal filter is higher than a current capacity of the second noise removal filter.

4. The power supply device according to claim 1,
wherein a noise attenuation capacity of the second noise removal filter is set based on a value obtained by subtracting a noise attenuation capacity of the first noise removal filter from a noise attenuation capacity required for removing a switching noise of the second switching power supply.

5. The power supply device according to claim 1,
wherein the external power supply includes a multiphase alternating-current (AC) power supply, the receiver is one of a plurality of receivers each for receiving power of respective one of phases of the multiphase AC power supply, the first switching power supply is one of a plurality of first switching power supplies, each of the plurality of first switching power supplies being disposed so as to correspond to respective one of the plurality of receivers, and the power supply device includes the plurality of receivers and the plurality of first switching power supplies.

6. The power supply device according to claim 5,
wherein the first noise removal filter is one of a plurality of first noise removal filters, each of the plurality of first noise removal filters being disposed between a corresponding one of the plurality of first switching power supplies and the power storage device, and the power supply device includes the plurality of first noise removal filters.

7. The power supply device according to claim 1 further comprising:

a third noise removal filter disposed between the receiver and the first switching power supply in the first power line; and a fourth noise removal filter disposed between the load device and the second switching power supply in the second power line.

8. The power supply device according to claim 1,
wherein each of the first noise removal filter and the second noise removal filter includes a common-mode choke coil.

* * * * *